United States Patent
Gross et al.

(10) Patent No.: US 10,929,776 B2
(45) Date of Patent: Feb. 23, 2021

(54) THERMALLY-COMPENSATED PROGNOSTIC-SURVEILLANCE TECHNIQUE FOR CRITICAL ASSETS IN OUTDOOR ENVIRONMENTS

(71) Applicant: Oracle International Corporation, Redwood Shores, CA (US)

(72) Inventors: Kenny C. Gross, Escondido, CA (US); Guang C. Wang, San Diego, CA (US); Edward R. Wetherbee, Omaha, NE (US)

(73) Assignee: Oracle International Corporation, Redwood Shores, CA (US)

( * ) Notice: Subject to any disclaimer, the term of this patent is extended or adjusted under 35 U.S.C. 154(b) by 344 days.

(21) Appl. No.: 16/186,365

(22) Filed: Nov. 9, 2018

(65) Prior Publication Data
US 2020/0151618 A1   May 14, 2020

(51) Int. Cl.
*G06N 20/00*    (2019.01)
*G06N 5/04*     (2006.01)
*G01R 31/62*    (2020.01)

(52) U.S. Cl.
CPC ............. *G06N 20/00* (2019.01); *G01R 31/62* (2020.01); *G06N 5/047* (2013.01)

(58) Field of Classification Search
CPC ......... G06N 20/00; G06N 5/047; G01R 31/62
See application file for complete search history.

(56) References Cited

U.S. PATENT DOCUMENTS

| | | | |
|---|---|---|---|
| 8,417,391 B1 * | 4/2013 | Rombouts | G05B 13/02 700/291 |
| 10,215,436 B1 * | 2/2019 | Rawski | F24F 11/86 |
| 10,837,925 B1 * | 11/2020 | Suzuki | G01N 23/223 |
| 10,859,283 B1 * | 12/2020 | Goodman | F24F 11/62 |

(Continued)

OTHER PUBLICATIONS

Qi ,statistical model-based methods for observation selection in wireless sensor networks and for feature selection in classification (Year: 2012).*

*Primary Examiner* — Mohammad K Islam
(74) *Attorney, Agent, or Firm* — Park, Vaughan, Fleming & Dowler LLP

(57) ABSTRACT

During operation, the system obtains time-series sensor signals gathered from sensors in an asset during operation of the asset in an outdoor environment, wherein the time-series sensor signals include temperature signals. Next, the system produces thermally-compensated time-series sensor signals by performing a thermal-compensation operation on the temperature signals to compensate for variations in the temperature signals caused by dynamic variations in an ambient temperature of the outdoor environment. The system then trains a prognostic inferential model for a prognostic pattern-recognition system based on the thermally-compensated time-series sensor signals. During a surveillance mode for the prognostic pattern-recognition system, the system receives recently-generated time-series sensor signals from the asset, and performs a thermal-compensation operation on temperature signals in the recently-generated time-series sensor signals. Finally, the system applies the prognostic inferential model to the thermally-compensated, recently-generated time-series sensor signals to detect incipient anomalies that arise during operation of the asset.

20 Claims, 13 Drawing Sheets

(56) References Cited

U.S. PATENT DOCUMENTS

| | | | | |
|---|---|---|---|---|
| 2006/0074598 | A1* | 4/2006 | Emigholz | G05B 23/021 |
| | | | | 702/185 |
| 2009/0063060 | A1* | 3/2009 | Sun | G01F 23/265 |
| | | | | 702/52 |
| 2010/0100337 | A1* | 4/2010 | Vichare | G06F 11/008 |
| | | | | 702/34 |
| 2010/0180663 | A1* | 7/2010 | Sun | G01N 33/2888 |
| | | | | 73/1.02 |
| 2013/0176418 | A1* | 7/2013 | Pandey | G01N 25/72 |
| | | | | 348/83 |
| 2015/0185716 | A1* | 7/2015 | Wichmann | F01K 23/101 |
| | | | | 700/287 |
| 2015/0331023 | A1* | 11/2015 | Hwang | G06Q 10/04 |
| | | | | 702/60 |
| 2017/0032745 | A1* | 2/2017 | Sakai | G09G 3/3406 |
| 2017/0305577 | A1* | 10/2017 | Bill | F16D 66/021 |
| 2017/0364043 | A1* | 12/2017 | Ganti | G05B 17/02 |

\* cited by examiner

THERMALLY-COMPENSATED PROGNOSTIC-SURVEILLANCE TECHNIQUE FOR CRITICAL ASSETS IN OUTDOOR ENVIRONMENTS

BACKGROUND

Field

The disclosed embodiments generally relate to techniques for performing prognostic-surveillance operations for critical assets based on time-series sensor signals. More specifically, the disclosed embodiments relate to a technique for performing thermal-compensation operations on temperature signals obtained from critical assets located in outdoor environments to facilitate subsequent prognostic-surveillance operations for the critical assets.

Related Art

In various industries, such as electrical utilities and oil & gas, critical assets often are situated in outdoor environments. A failure in one of these critical assets can have serious consequences, so it is desirable to be able to proactively determine when such assets are likely to fail. This makes it possible to perform remedial actions to prevent such failures or to mitigate the consequences of the failures.

For example, consider transformers in electrical grids. Transformer explosions can potentially cause fires, which can result in significant property damage and injuries. Hence, it is desirable to perform prognostic-surveillance operations to detect the onset of local hotspots inside the transformers. This makes it possible to provide advance warning of impending transformer failures.

The present state of the art for transformer monitoring is Dissolved Gas Analysis (DGA). DGA operates by detecting the presence of dissolved hydrocarbon gasses in oils, which are used to bathe the transformer windings. When hotspots inside the transformers become hot enough to generate hydrocarbon gasses, this indicates a problem in the transformers. The problem with DGA analysis is that it requires oil samples to be periodically extracted from transformers for chemical analyses to detect the presence of the gasses. This process is both time-consuming and expensive, which makes it feasible to only conduct a limited number of DGA analyses. Hence, DGA analysis is essentially "reactive" and not "prognostic" because it detects the downstream symptoms of problems, well after the conditions caused hotspots that were sufficient to "bake out" the hydrocarbon gasses.

Note that machine-learning (ML) techniques have significant potential to improve prognostic-surveillance operations on transformers. (For a related example in the electrical power industry, see U.S. patent application Ser. No. 15/826,461, entitled "Bivariate Optimization Technique for Tuning SPRT Parameters to Facilitate Prognostic Surveillance of Sensor Data from Power Plants," by inventors Kenny C. Gross, et al., filed on 12 Dec. 2017.) However, ambient temperature variations in the outdoor environments in which transformers are located makes it hard to determine when transformers are likely to fail.

Hence, what is needed is a technique for proactively determining when critical assets located in outdoor environments, such as transformers, are likely to fail without the above-described shortcomings of existing techniques.

SUMMARY

The disclosed embodiments provide a system that performs thermally-compensated prognostic-surveillance operations for an asset located in an outdoor environment. During operation, the system obtains time-series sensor signals gathered from sensors in the asset during operation of the asset, wherein the time-series sensor signals include temperature signals. Next, the system produces thermally-compensated time-series sensor signals by performing a thermal-compensation operation on the temperature signals to compensate for variations in the temperature signals caused by dynamic variations in an ambient temperature of the outdoor environment. The system then trains a prognostic inferential model for a prognostic pattern-recognition system based on the thermally-compensated time-series sensor signals. During a surveillance mode for the prognostic pattern-recognition system, the system receives recently-generated time-series sensor signals from the asset, and performs a thermal-compensation operation on temperature signals in the recently-generated time-series sensor signals. Finally, the system applies the prognostic inferential model to the thermally-compensated, recently-generated time-series sensor signals to detect incipient anomalies that arise during operation of the asset.

In some embodiments, while applying the prognostic inferential model to the thermally-compensated, recently-generated time-series sensor signals, the system uses the prognostic inferential model to generate estimated values for the thermally-compensated, recently-generated time-series sensor signal. Next, the system performs a pairwise differencing operation between actual values and the estimated values for the thermally-compensated, recently-generated time-series sensor signals to produce residuals. Finally, the system performs a sequential probability ratio test (SPRT) on the residuals to detect the incipient anomalies that arise during operation of the asset.

In some embodiments, while performing the thermal-compensation operation on the temperature signals, the system estimates the ambient temperature in the outdoor environment by averaging the temperature signals at each observation point in the temperature signal. Next, the system subtracts the ambient temperature from each observation in each temperature signal to produce a corresponding thermally-compensated temperature signal.

In some embodiments, while averaging the temperature signals at each observation point, the system uses an adaptive weighting function. During this process, the system computes a standard deviation (STD) for each of the temperature signals $[T_1, T_2, \ldots, T_N]$. Next, the system computes an inverse STD weight $W_i$ for each computed $STD_i$, wherein $W_i = 1/STD_i$. Finally, the system uses the computed inverse STD weights $[W_1, W_2, \ldots, W_N]$ to estimate the ambient temperature $$T_{amb} = \frac{\sum_{1}^{N} W_i T_i}{\sum_{1}^{N} W_i}$$

for each observation point in the temperature signals.

In some embodiments, while computing the STD for each of the temperature signals, the system identifies a window in the temperature signals for which loads in the asset are substantially at steady state. Next, the system computes an STD for each of the temperature signals based on temperature values from the window.

In some embodiments, the inferential model comprises a nonlinear, nonparametric (NLNP) regression model.

In some embodiments, the inferential model comprises a Multivariate State Estimation Technique (MSET) model.

In some embodiments, the incipient anomalies comprise indicators of an impending failure of the asset.

In some embodiments, the asset comprises an electrical transformer in an electrical distribution system.

In some embodiments, in addition to temperature signals, the time-series sensor signals include signals obtained from one or more of the following types of sensors: a voltage sensor; a current sensor; a pressure sensor; a rotational-speed sensor; and a vibration sensor.

DETAILED DESCRIPTION

Figure 1:
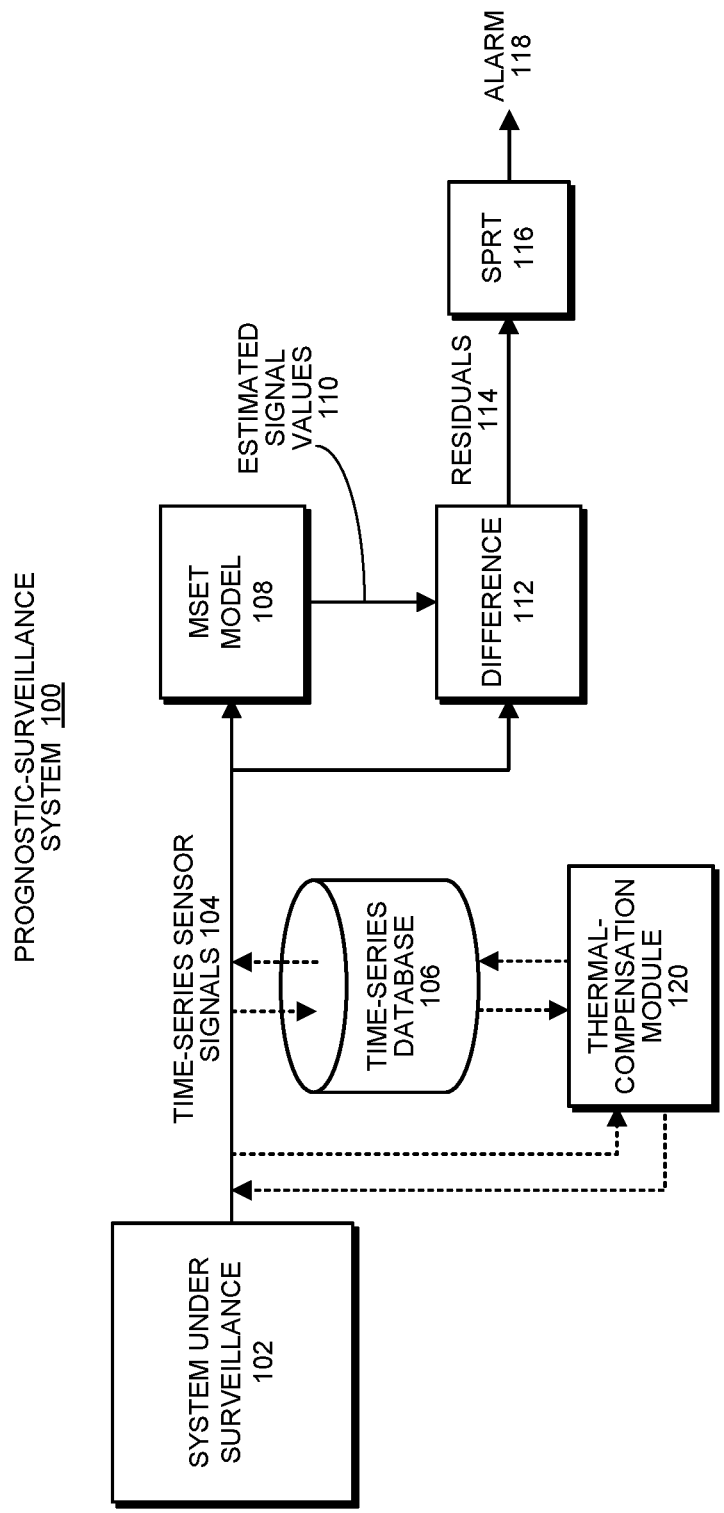
FIG. 1 illustrates an exemplary prognostic-surveillance system in accordance with the disclosed embodiments.

The following description is presented to enable any person skilled in the art to make and use the present embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present embodiments. Thus, the present embodiments are not limited to the embodiments shown, but are to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Overview

As mentioned above, ML techniques have significant potential to facilitate performing prognostic-surveillance operations on critical assets, such as transformers, which are located in outdoor environments. However, a significant challenge associated with using ML techniques in this way arises from the fact that ambient temperature dynamics are superimposed on the load-driven thermal dynamics of the thermal sensors inside the transformers. (Note that the ambient temperature dynamics are associated with the outside temperature variations in the vicinity of the transformer.) The largest ambient variations are due to two phenomena that happen anywhere grid transformers are deployed in the world.

(1) Diurnal variations in ambient temperature are caused by day-to-night variations in temperature and can vary ±40° F. or more, in any part of the world.

(2) Seasonal variations in ambient temperature can easily superimpose an additional ±60° F. variation in temperature.

Note that ambient thermal variations are reflected throughout all internal thermal sensors in any outdoor asset, including transformers. This produces challenges for all types of advanced ML prognostics that monitor these temperature signals, including the following challenges.

(A) ML-based prognostics operate by "learning" the thermal dynamics of internal components as a multivariate function of load dynamics. As electrical distribution load varies dynamically, the internal temperatures have complex dynamics that vary not only as a function of load dynamics, but also as a function of internal cooling systems, such as fans, blowers, and oil-recirculation pumps. These superimposed ambient dynamics can "blur" the thermal dynamics due to load and cooling component dynamics and make it more challenging for ML pattern recognition to detect the incipience or onset of internal degradation mechanisms.

(B) State-of-the-art prognostic techniques for transformers are presently "threshold-based." This means that if an internal thermal sensor rises above a pre-specified threshold, an alarm indicating a local hotspot will be triggered. However, this type of threshold-based approach is severely handicapped because the threshold has to be placed above the highest temperature that any internal component will see throughout the year. For example, it is well-known that the ambient temperature in the Chicago area can reach 98° F. in August. If internal component temperatures from load dynamics can be 20° F. higher during normal operation with undegraded operation of transformers, then the alarm thresholds have to be placed at 118° F. (Otherwise, "false alarms" will be generated during the hottest summer months.) This means that "threshold-based" prognostics are unlikely to detect local hotspots during the rest of the year, for example where ambient temperatures in Chicago can dip below −20° F. in January.

(C) No existing ML techniques can detect degradation in signals outside the training range for the time-series signals used for training. This creates a special challenge for critical assets, because it requires collection of "training data" over one or more years of ambient temperatures. For example, if the utility were to collect all sensor signals from all of their transformers during just two winter months (e.g., December and January) to "train" their ML prognostics for field transformers, then later in the summer when temperatures throughout the transformer could easily reach 40-50° F. higher, the ML prognostics will generate alarms in internal thermal sensors. Note that it is extremely "expensive" to collect training data for one or more years to ensure that one collects enough data to span the full range of environmental variables for an outdoor asset. Hence, it is desirable to be able to de-couple the thermal dynamics from inside the asset, from the ambient thermal dynamics caused by diurnal and seasonal variations in temperature.

We have developed a new "ambient-temperature-compensation" technique that automatically filters out external ambient thermal dynamic patterns to expose the underlying internal thermal dynamic patterns. This new technique is robust with respect to reliability issues that arise when system vendors install an "external ambient temperature sensor" on critical assets. If we try to disambiguate external ambient thermal dynamics from internal load-driven thermal dynamics by use of an external thermal sensor, the external thermal sensors, which are located in harsh environments, have a very poor mean-time-between-failure (MTBF), which means that the disambiguation operations are likely to be inaccurate. Moreover, it is not economically feasible for utilities with hundreds of grid transformers to send technicians to recalibrate external thermal sensors on critical assets. We have already discovered multiple instances where external sensors on assets have failed due to "stuck-at" faults (i.e., the sensor goes to a flat line and is no longer responding, which can never be caught by a "threshold-limit" type diagnostic check), and where external sensors drift out of calibration by a common mechanism called linear "de-calibration bias."

The new ambient-temperature-compensation technique taught herein is robust with respect to external ambient-sensor calibration status, and additionally allows ML-based prognostics to be trained with relatively short telemetry streams from any time period during the year (e.g., only one to two months), and will detect prognostic anomalies even during seasons that may become 50° F. hotter or 50° F. colder than during the training period. Hence, the new technique can provide higher accuracy prognostics for utility operators, with much earlier advanced warning than conventional DGA analyses.

We make use of a new ambient-temperature pattern recognition "inferencing" technique that disambiguates ambient-temperature thermal dynamics from the two primary sources of internal thermal dynamics, namely load-driven dynamics and the cooling-system dynamics. The ability to accurately infer and disambiguate ambient thermal dynamic patterns from load and cooling thermal dynamic patterns substantially enhances prognostic accuracy. Moreover, the new technique facilitates training of prognostic pattern-recognition models with relatively short segments of training data captured during one season of the year, and then deploying the ML prognostics throughout the year, even though temperatures inside the assets may become much hotter or colder during other seasons.

This new procedure operates by applying a "modified parity-space technique" to distributed temperature sensors inside the transformer. Note that we are adapting a modified parity-space technique devised for a completely different application domain, namely electro-magnetic interference (EMI) signals in enterprise computing servers. (See U.S. Pat. No. 8,224,493 entitled "Noise Reduction Technique for Monitoring Electromagnetic Signals," by inventors R. C. Dhanekula, et al., filed 20 Jun. 2009, and issued 14 Aug. 2012.) Note that the conventional "parity-space" technique is well-known and has been used in other application domains to detect sensor degradation in systems with multiple, redundant sensors. For example, if one has five redundant sensors measuring radiation, one can take the mean of all five signals, and then subtract each individual sensor from the mean, producing a "residual" signal. If the residual signal starts to grow for any given sensor, this means the given sensor is drifting away from the other four redundant sensors, which triggers an alarm for sensor degradation.

The modified parity-space technique enhances the conventional parity-space technique by "de-tuning" the dependence on the noisiest sensors, and "boosting" the dependence on the cleanest sensors. To adapt the modified parity-space technique to distributed thermal sensors in outdoor critical assets, we first identify "quiescent" time periods when internal temperatures are at steady state, which means that electrical loads are at steady state. Note that if workloads are high and dynamic, then internal temperatures will also be dynamic, so it would not be possible to infer the "noisiness" of the distributed temperature sensors. We begin by using a moving-window Mann-Kendall technique that sifts through historical signals for the transformer, looking specifically at the internal thermal sensors, and identifying the longest window for which the temperatures (and, hence, loads) are at steady state. (Note that we only need to identify a couple hours of steady state data to infer sensor "noisiness," but typically there exist many hours of steady state thermal data for transformers per month.)

The term "steady state" with respect to transformer load dynamics refers to quiescent times. This can include time periods in the middle of the night, when a nearby business customer is inactive, and can also include maximum-load time periods when all feeds are maxed out (e.g., a very hot afternoon when air conditioners are operating). They can also include times when all loads have been routed away from a given transformer for a periodic manual inspection.

(In this case, all the thermal sensors continue operating, even though the electrical workload is temporarily turned off.)

During the first step in the ambient-compensation process, we sift through historical signals from a transformer and select the longest window (e.g., greater than two hours) for which the loads are at steady state. We then extract all thermal sensor data for this window, and compute the standard deviation for each of the thermal sensors. (Note that when the loads are at steady state, the standard deviation provides a measure of the noisiness or uncertainty level for each sensor.) Next, we compute an adaptive weighting factor for each signal, which is the inverse of the standard deviation (STD) signal. This provides a measure of the "cleanness" of the signal, which makes it possible to selectively de-tune the noisiest signals from the analysis, while the cleanest signals are boosted.

To recap, the steps in the modified-parity space are as follows. We first calculate the STD, for each internal thermal sensor i during a stationary interval. Next, we calculate a weighting factor for each sensor using the formula $W_i=(1/STD_i)/(1/STD_{sum})$, where $STD_{sum}$ is the sum of standard deviation of all residuals. We then collect time-series signals from N thermal sensors in the system, wherein N>1. Next, we compute a dynamic weighted aggregate mean for the N time-series signals using the adaptive weighting factors $W_i$ computed above. We then compute N "residual functions" by subtracting the raw input signals from the dynamic weighted aggregate mean, or the technique works equivalently well by subtracting the dynamic weighted aggregate mean from the raw input signals (the ambient dynamics are "filtered" from the residuals either way). We then train an MSET regression model using the N residual functions, wherein the MSET regression model is used to perform subsequent prognostic-surveillance operations. The above-described process effectively filters out ambient background thermal dynamics so that the adaptively corrected signals reflect local perturbations inside the asset under surveillance, but common variations from "background" diurnal and seasonal variations have now been removed.

Additional details about this ambient-temperature-compensation technique are described in more detail below with respect to FIGS. 1-13.

Prognostic-Surveillance System

We first describe an exemplary prognostic-surveillance system in which the new ambient-temperature-compensation technique operates. For example, FIG. 1 illustrates an exemplary prognostic-surveillance system 100 that makes use of a time-series database 106 containing time-series signals obtained from sensors in accordance with the disclosed embodiments. As illustrated in FIG. 1, prognostic-surveillance system 100 operates on a set of time-series sensor signals 104 obtained from sensors in a system under surveillance 102. Note that system under surveillance 102 can generally include any type of machinery or facility, which includes sensors and generates time-series signals. Moreover, time-series signals 104 can originate from any type of sensor, which can be located in a component in system under surveillance 102, including: a voltage sensor; a current sensor; a pressure sensor; a rotational speed sensor; and a vibration sensor.

During operation of prognostic-surveillance system 100, time-series signals 104 can feed into a time-series database 106, which stores the time-series signals 104 for subsequent analysis. Next, the time-series signals 104 either feed directly from system under surveillance 102 or from time-series database 106 into an MSET pattern-recognition model 108. Although it is advantageous to use MSET for pattern-recognition purposes, the disclosed embodiments can generally use any one of a generic class of pattern-recognition techniques called nonlinear, nonparametric (NLNP) regression, including neural networks, support vector machines (SVMs), auto-associative kernel regression (AAKR), and even simple linear regression (LR).

Next, MSET model 108 is "trained" to learn patterns of correlation among all of the time-series signals 104. This training process involves a one-time, computationally intensive computation, which is performed offline with accumulated data that contains no anomalies. The pattern-recognition system is then placed into a "real-time surveillance mode," wherein the trained MSET model 108 predicts what each signal should be, based on other correlated variables; these are the estimated signal values 110 illustrated in FIG. 1. Next, the system uses a difference module 112 to perform a pairwise differencing operation between the actual signal values and the estimated signal values to produce residuals 114. The system then performs a "detection operation" on the residuals 114 by using SPRT module 116 to detect anomalies and possibly to generate an alarm 118. (For a description of the SPRT model, please see Wald, Abraham, June 1945, "Sequential Tests of Statistical Hypotheses." *Annals of Mathematical Statistics.* 16 (2): 117-186.) In this way, prognostic-surveillance system 100 can proactively alert system operators of incipient anomalies, such as impending failures, hopefully with enough lead time so that such problems can be avoided or proactively fixed while the anomalies are small and well before progressing into a catastrophic failure.

Prognostic-surveillance system 100 also includes a thermal-compensation module 120, which performs thermal-compensation operations to filter out the effects of ambient external temperature variations as is described in more detail below. Note that thermal-compensation module 120 can operate on signals stored in time-series database 106, or alternatively can operate directly on time-series sensor signals 104 before time-series sensor signals 104 feed into MSET model 108.

Prognostic-Surveillance Operation

Figure 2:
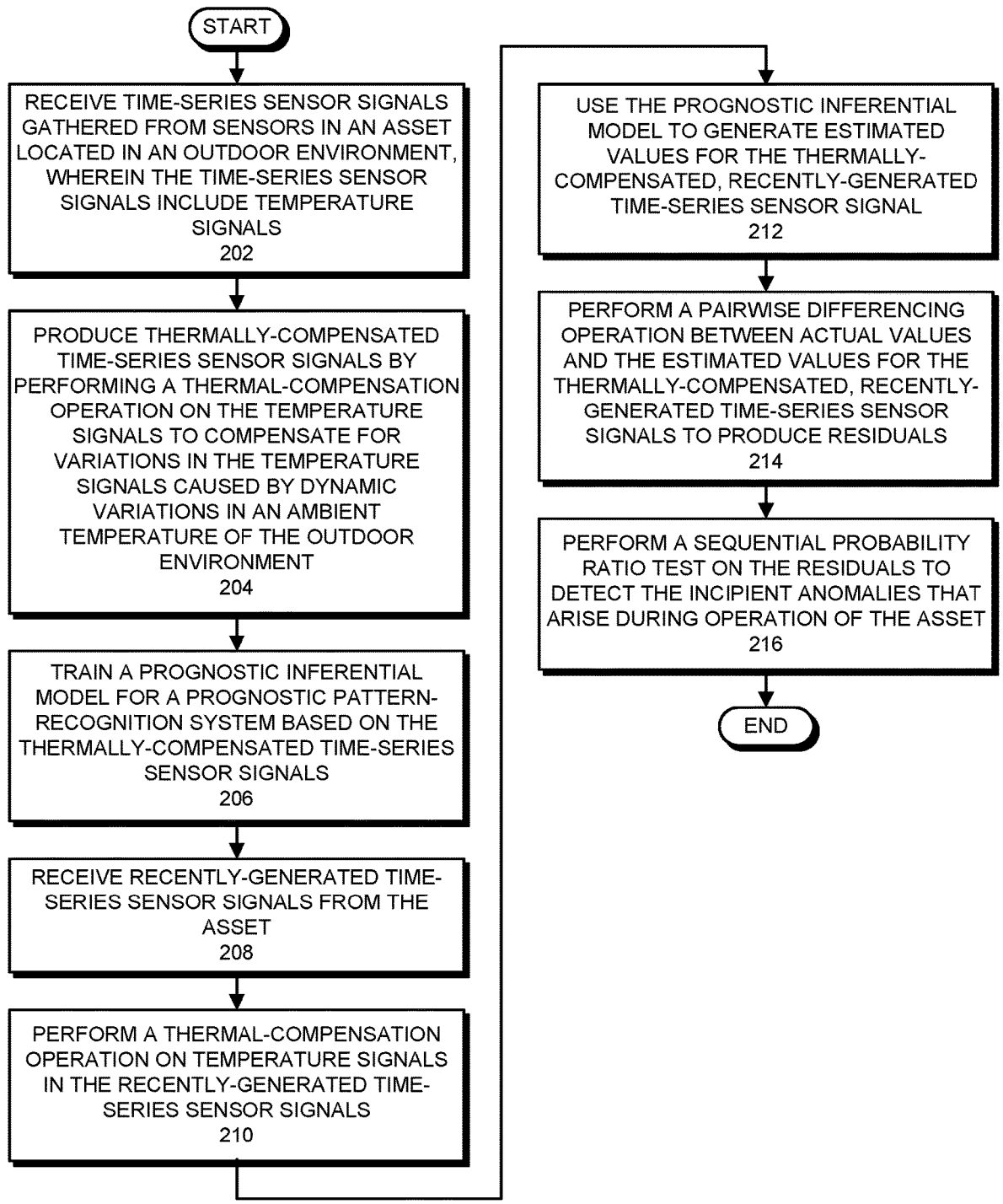
FIG. 2 presents a flow chart illustrating steps involved in performing a prognostic-surveillance operation in accordance with the disclosed embodiments.

FIG. 2 presents a flow chart illustrating steps involved in performing a prognostic-surveillance operation in accordance with the disclosed embodiments. During operation, the system receives time-series sensor signals gathered from sensors in an asset located in an outdoor environment, wherein the time-series sensor signals include temperature signals (step 202). Next, the system produces thermally-compensated time-series sensor signals by performing a thermal-compensation operation on the temperature signals to compensate for variations in the temperature signals caused by dynamic variations in an ambient temperature of the outdoor environment (step 204). The system then trains a prognostic inferential model for a prognostic pattern-recognition system based on the thermally-compensated time-series sensor signals (step 206). Next, during a surveillance mode for the prognostic pattern-recognition system, the system receives recently-generated time-series sensor signals from the asset (step 208), and performs a thermal-compensation operation on temperature signals in the recently-generated time-series sensor signals (step 210). Next, the system uses the prognostic inferential model to generate estimated values for the thermally-compensated, recently-generated time-series sensor signal (step 212). The system then performs a pairwise differencing operation between actual values and the estimated values for the thermally-compensated, recently-generated time-series sensor signals to produce residuals (step 214). Finally, the system performs a sequential probability ratio test on the residuals to detect the incipient anomalies that arise during operation of the asset (step 216).

Thermal-Compensation Operation

Figure 3:
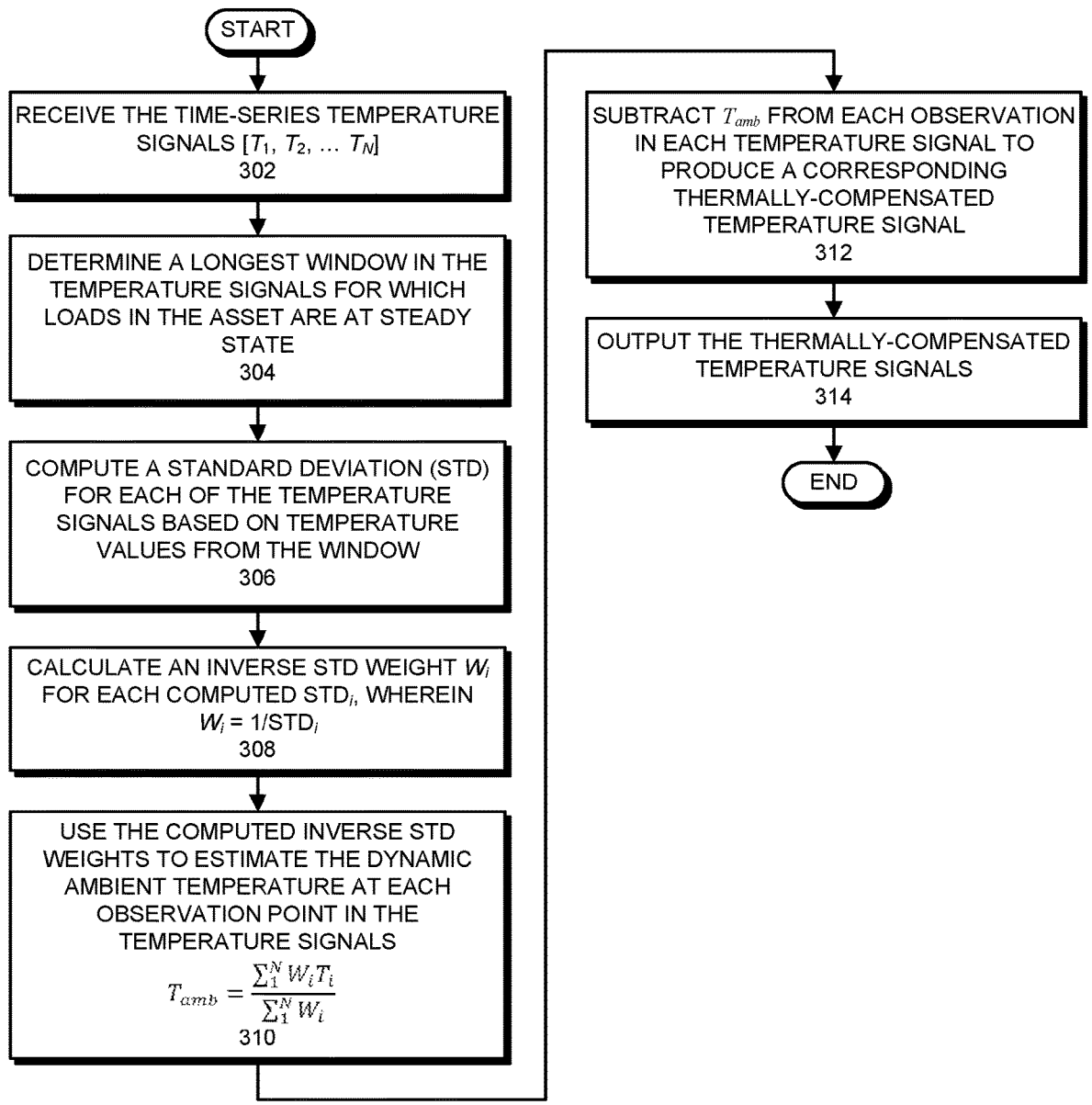
FIG. 3 illustrates the process of performing a thermal-compensation operation in accordance with the disclosed embodiments.

FIG. 3 illustrates the process of performing a thermal-compensation operation (as in step 204 above) in accordance with the disclosed embodiments. First, the system receives the time-series temperature signals $[T_1, T_2, \ldots, T_N]$ (step 302). Next, the system determines a longest window in the temperature signals for which loads in the asset are at steady state (step 304). The system then computes a standard deviation (STD) for each of the temperature signals $[T_1, T_2, \ldots, T_N]$ based on temperature values from the window (step 306). Next, the system computes an inverse STD weight $W_i$ for each computed $STD_i$, wherein $W_i=1/STD_i$ (step 308). The system then uses the computed inverse STD weights $[W_1, W_2, \ldots, W_N]$ to estimate the ambient temperature $$T_{amb} = \frac{\sum_{1}^{N} W_i T_i}{\sum_{1}^{N} W_i}$$

for each observation point in the temperature signals (step 310). Next, the system subtracts $T_{amb}$ from each observation in each temperature signal to produce a corresponding thermally-compensated temperature signal (step 312). Finally, the system outputs the thermally-compensated temperature signals (step 314).

Empirical Results

FIGS. 4-13 illustrate empirical results generated based on simulated signals from three grid transformers, labeled TR1, TR2, and TR3. Note that, although we are using high-fidelity simulated signals, these simulated signals exhibit actual transformer signal thermal dynamics that the inventors observed in real transformer telemetry data. For these simulations, TR1 represents a transformer for which the external ambient temperature sensor has already failed. For such transformers, and for transformers that do not have an external temperature sensor, we demonstrate that the new ambient-temperature-compensation technique does a good job in producing compensated internal signals.

Figure 4:
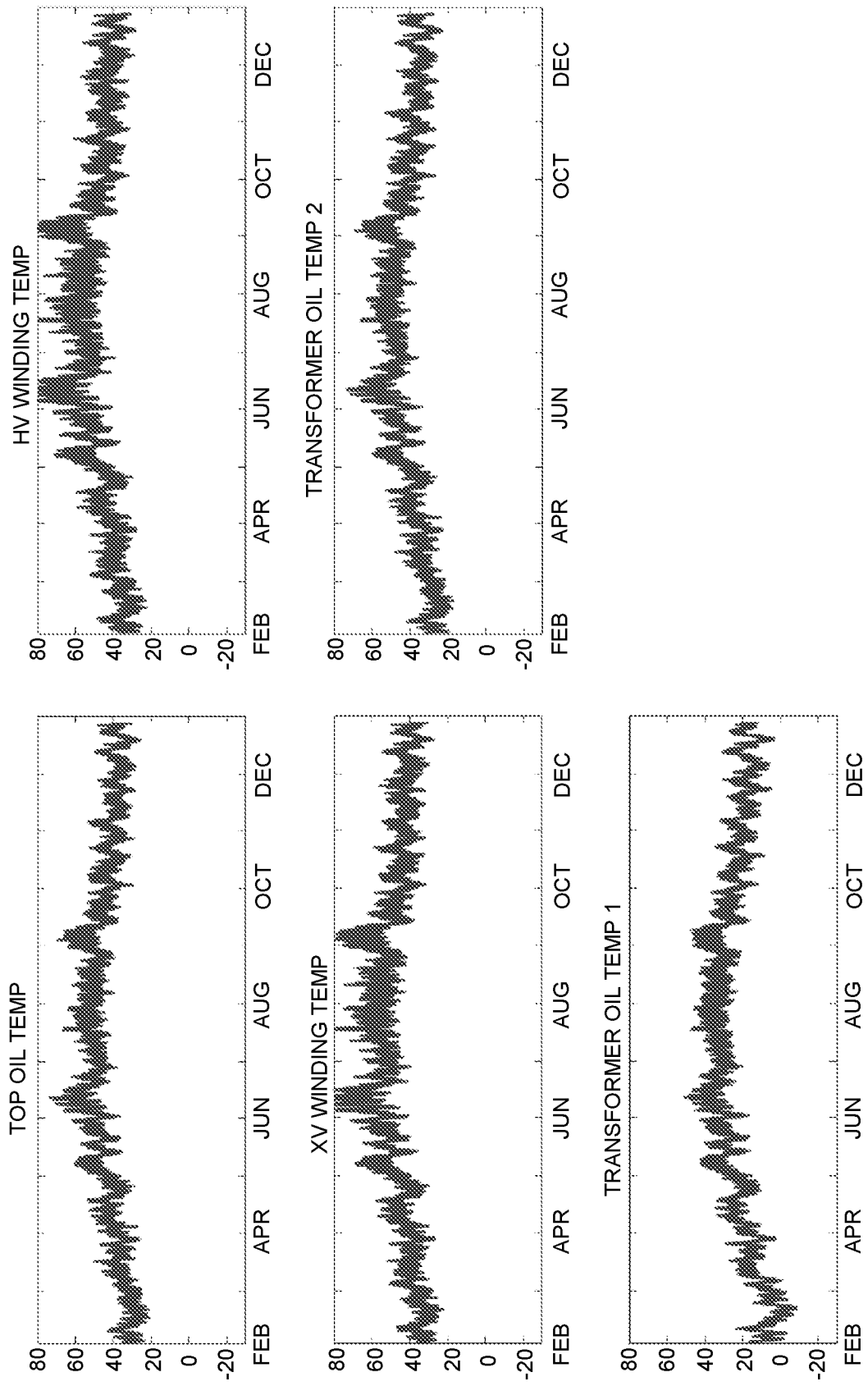
FIG. 4 presents graphs illustrating raw data gathered from thermal sensors inside a first transformer in accordance with the disclosed embodiments.

For example, FIG. 4 illustrates raw data obtained from five internal thermal sensors deployed on components inside transformer TR1 over a one-year period. Note that the temperatures are in ° C. and exhibit typical seasonal and diurnal thermal dynamics that are reflected through the internal temperature sensors.

Figure 5:
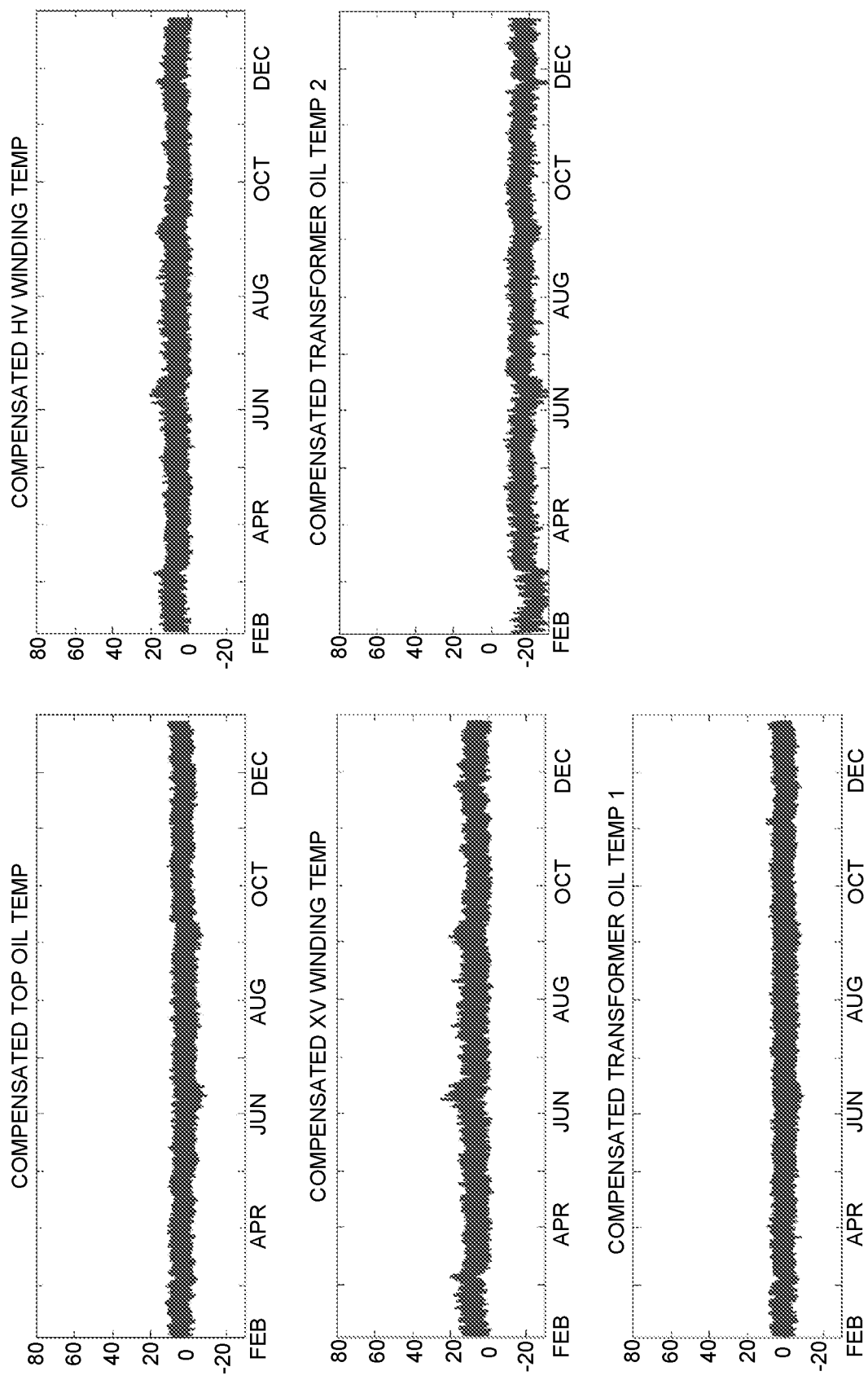
FIG. 5 presents graphs illustrating corresponding thermally-compensated data gathered from the thermal sensors inside the first transformer in accordance with the disclosed embodiments.

FIG. 5 shows corresponding "ambient-compensated" internal thermal signals for TR1 for which "external" ambient dynamics have been effectively removed. Note that the load dynamics in these ambient-compensated signals are no longer contaminated with superimposed ambient dynamics and can now be directly analyzed using inferential prognostics.

Figure 6:
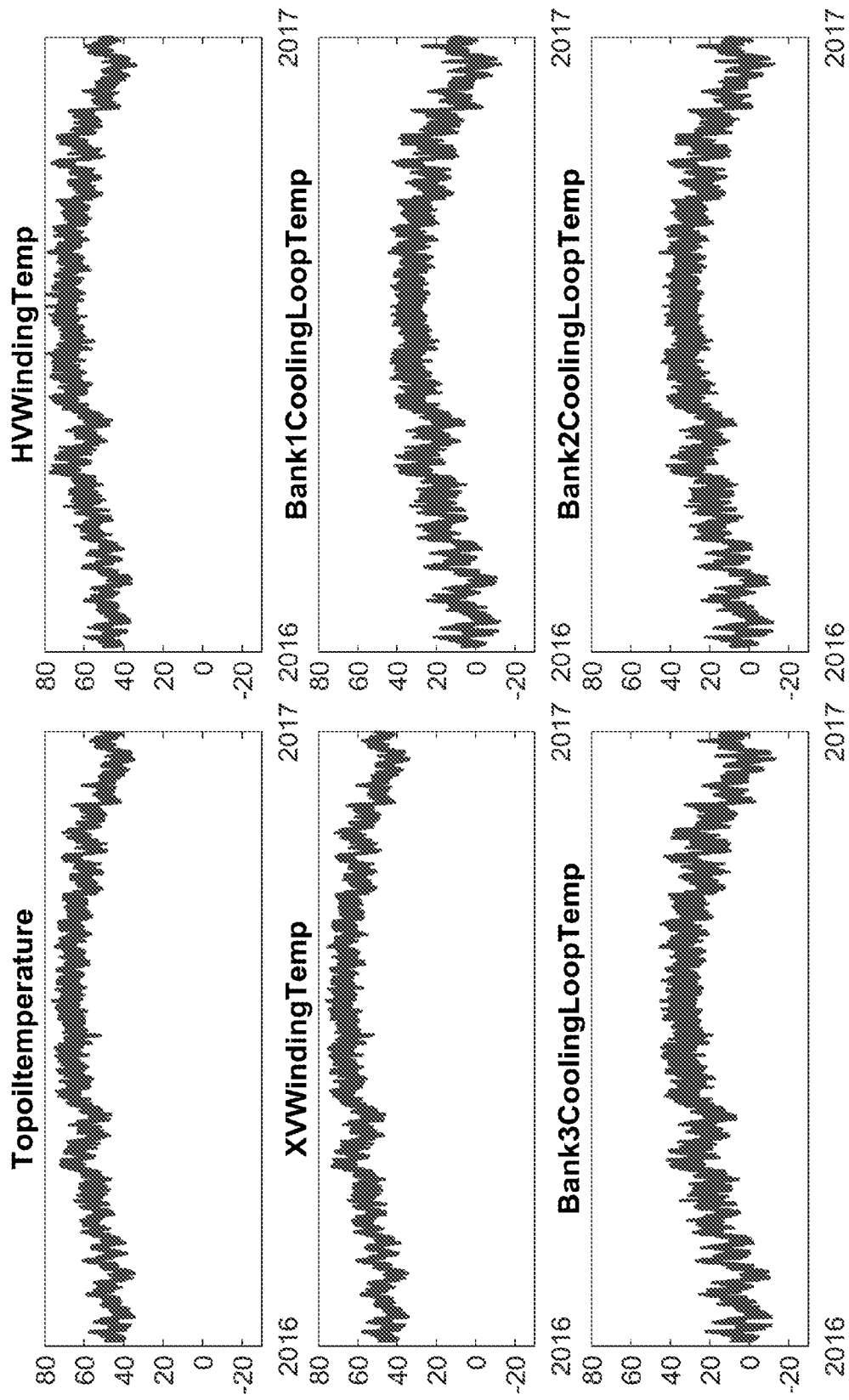
FIG. 6 presents graphs illustrating raw data gathered from thermal sensors inside a second transformer in accordance with the disclosed embodiments.

We now explore the fidelity of the "inferred-ambient" signals by directly comparing the correlation of the load dynamics for $T_{amb}$ with the load dynamics for two transformers that have functioning external ambient temperature sensors. Accordingly, in FIGS. 6 and 7, we apply the new ambient-temperature-compensation technique to thermal signals from TR2, as if there were no external ambient temperature sensor. FIG. 6 illustrates the raw signals.

Figure 7:
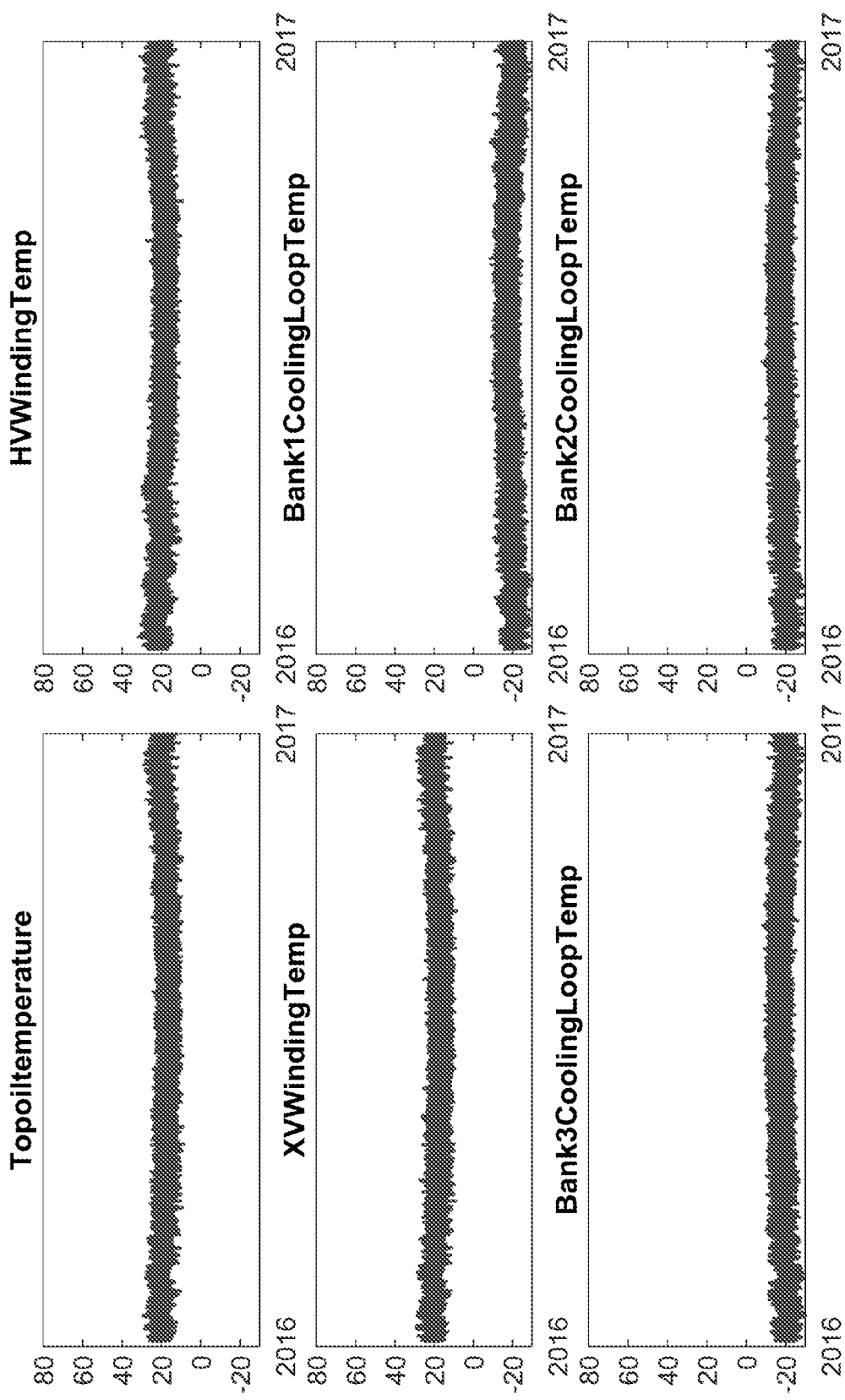
FIG. 7 presents graphs illustrating corresponding thermally-compensated data gathered from the thermal sensors inside the second transformer in accordance with the disclosed embodiments.

In contrast, FIG. 7 illustrates corresponding "stationary" thermal signals for which ambient seasonal and diurnal variations have been "automatically filtered" with the new ambient-temperature-compensation technique. Note that there is now a stationary mean, with load dynamics that are dependent only on transformer load dynamics, and are uncontaminated by external ambient dynamics.

Figure 8:
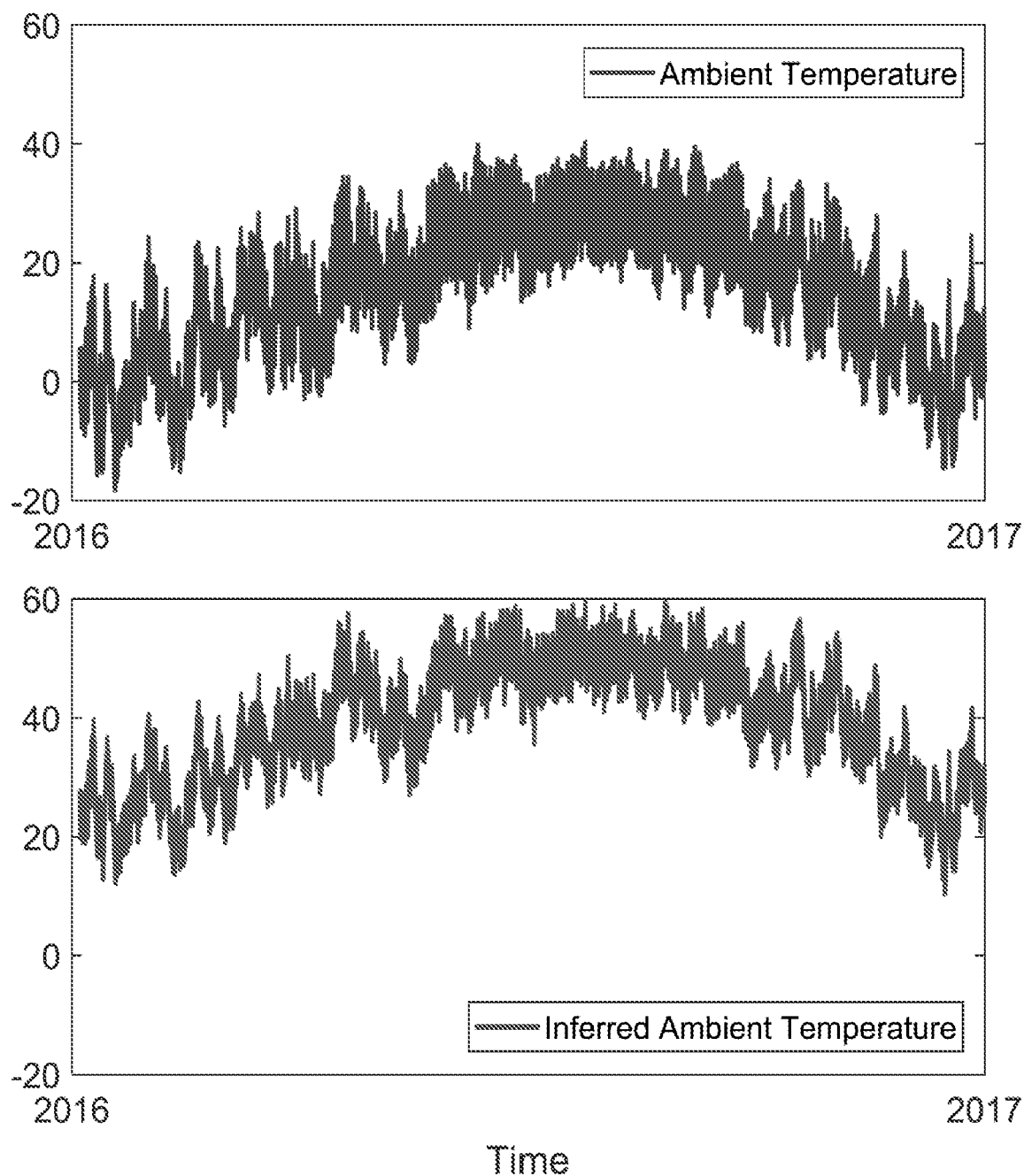
FIG. 8 presents graphs illustrating the correlation between an inferred-ambient temperature and a measured-ambient temperature for the second transformer in accordance with the disclosed embodiments.
Figure 9:
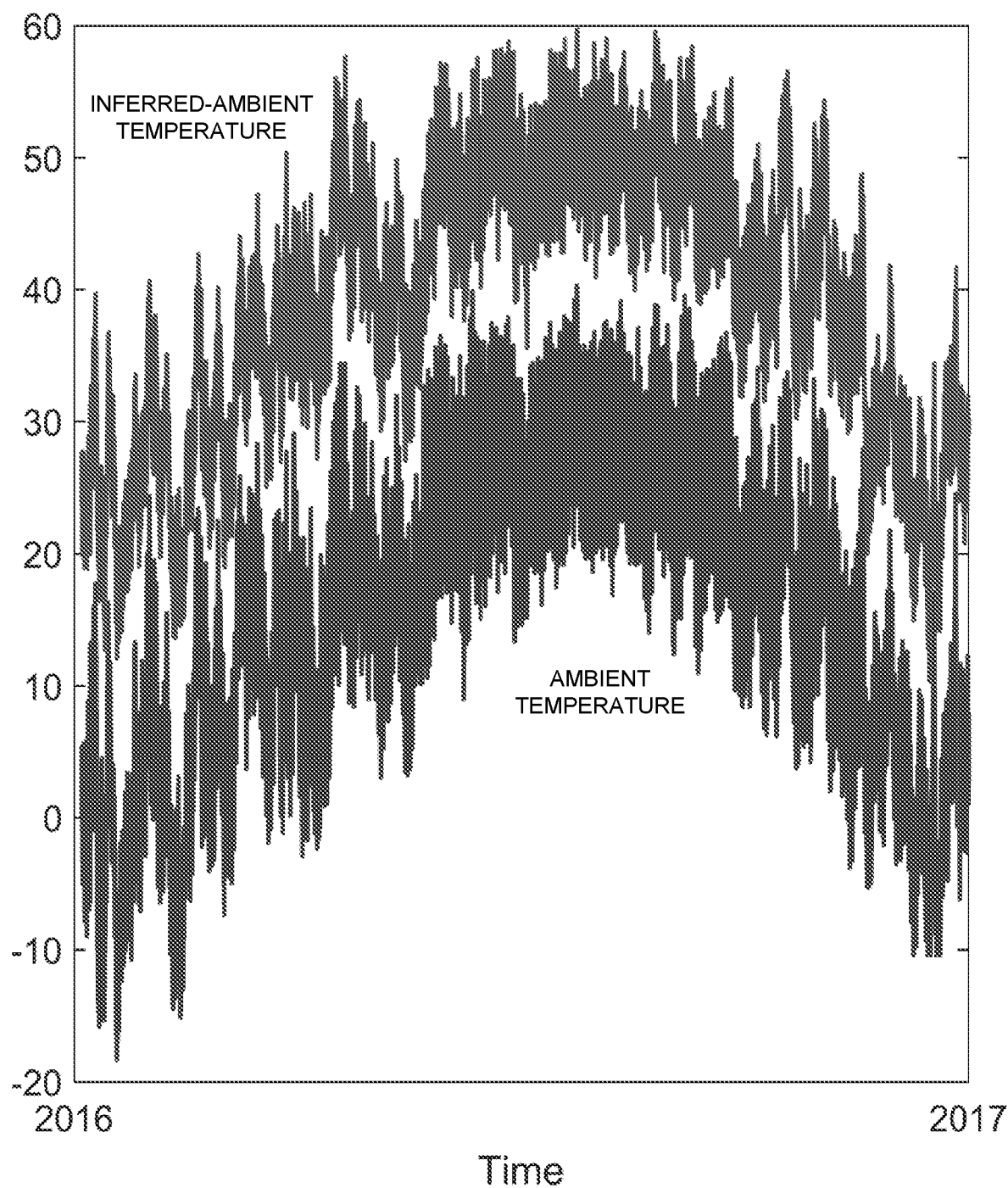
FIG. 9 presents a graph illustrating an overlay comparison between inferred and ambient temperatures for the second transformer in accordance with the disclosed embodiments.

FIGS. 8 and 9 exhibit the excellent correlation in thermal dynamics between the "inferred ambient" signal for TR2 versus the measured-ambient signal. Note that what is important for ML prognostics involving the "ambient compensated" signals is the dynamic characteristics, not the vertical offset. There is a vertical offset simply because the internal signals are always warmer than the external ambient temperature, much as distributed temperatures under the hood of an operating car are always warmer than outside ambient temperatures. FIG. 9 illustrates the excellent correlation content for the "inferred-ambient" versus the measured-ambient temperatures.

Figure 10:
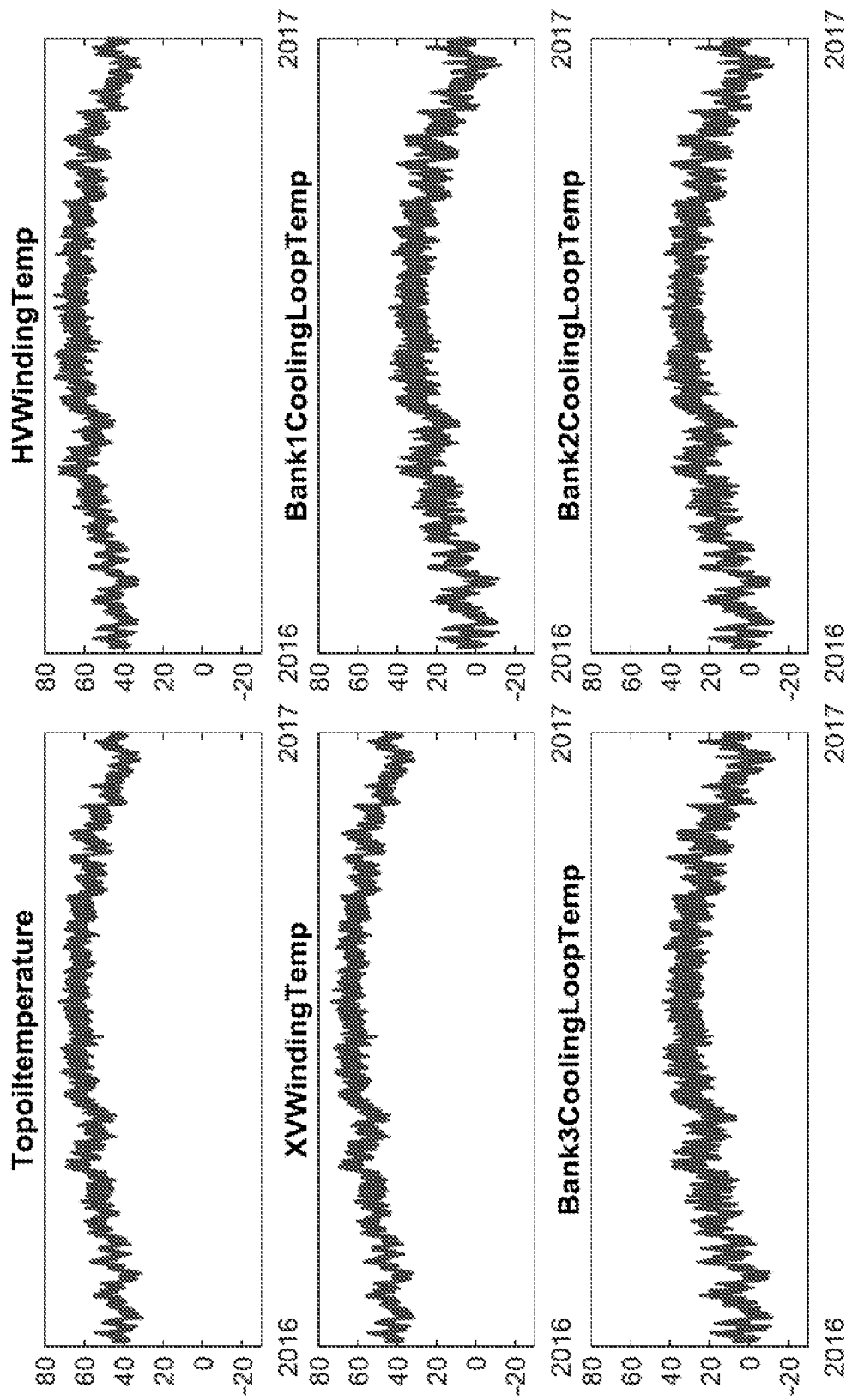
FIG. 10 presents graphs illustrating raw data gathered from thermal sensors inside a third transformer in accordance with the disclosed embodiments.
Figure 11:
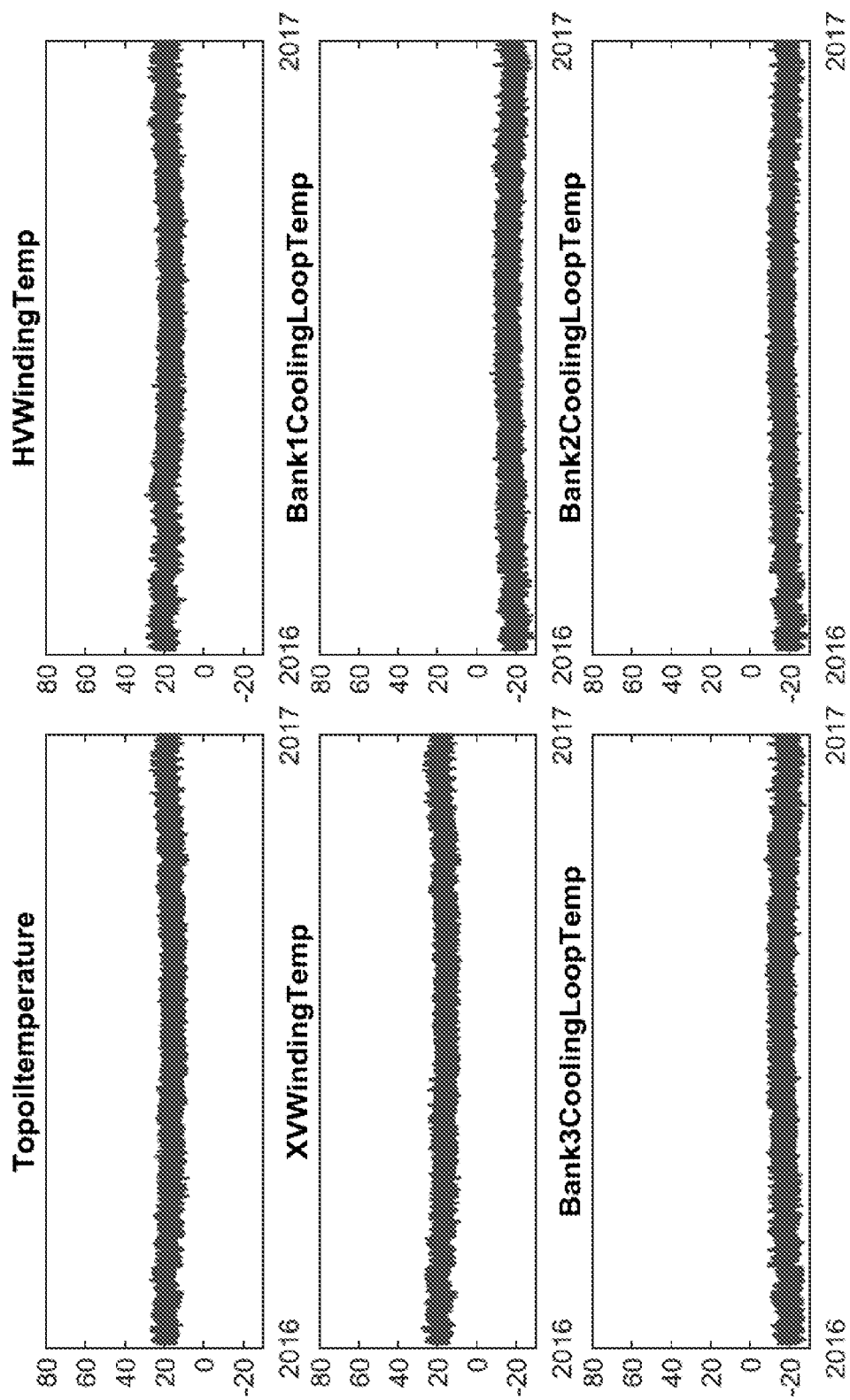
FIG. 11 presents graphs illustrating corresponding thermally-compensated data gathered from the thermal sensors inside the third transformer in accordance with the disclosed embodiments.
Figure 12:
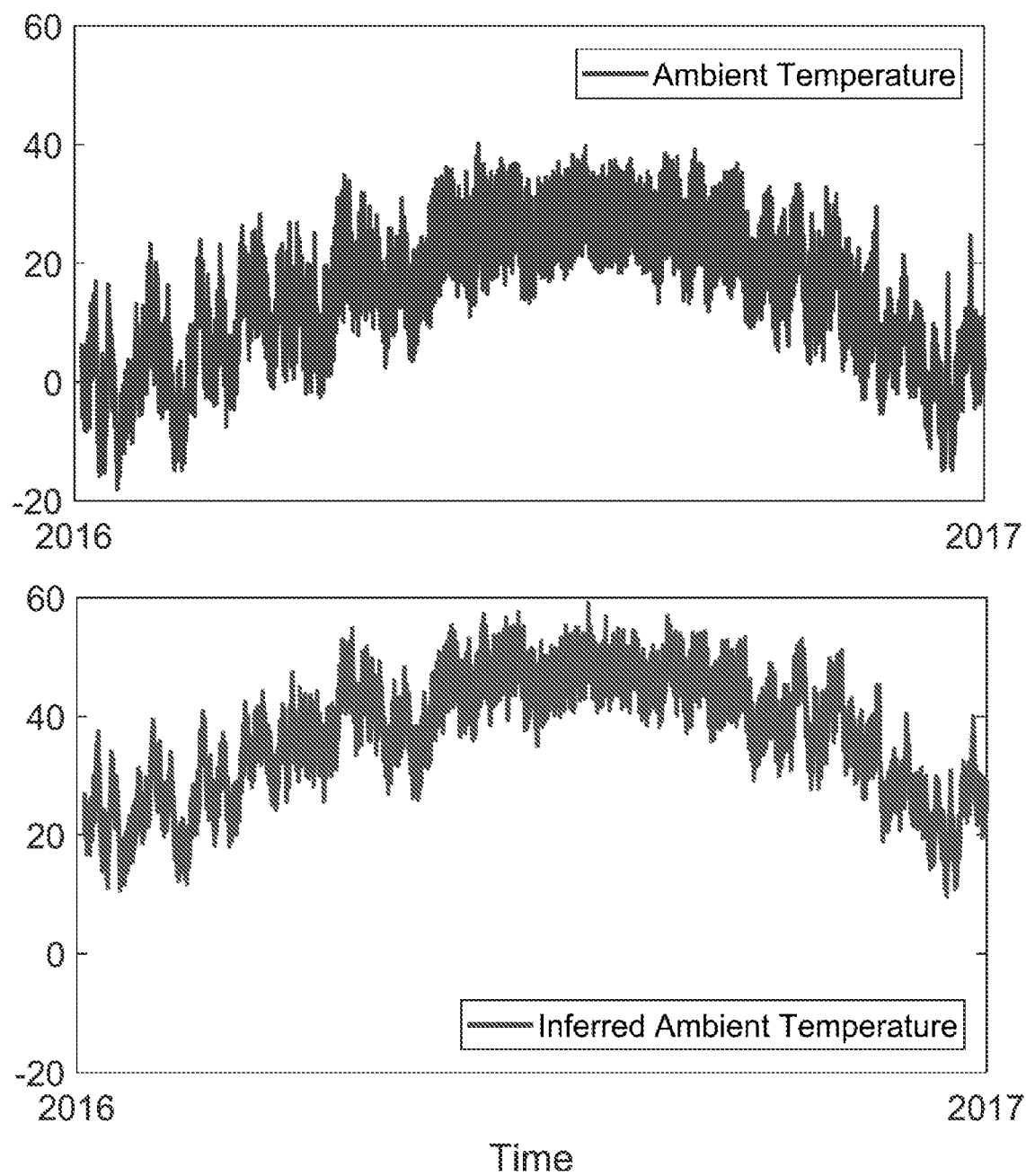
FIG. 12 presents graphs illustrating the correlation between an inferred-ambient temperature and a measured-ambient temperature for the third transformer in accordance with the disclosed embodiments.
Figure 13:
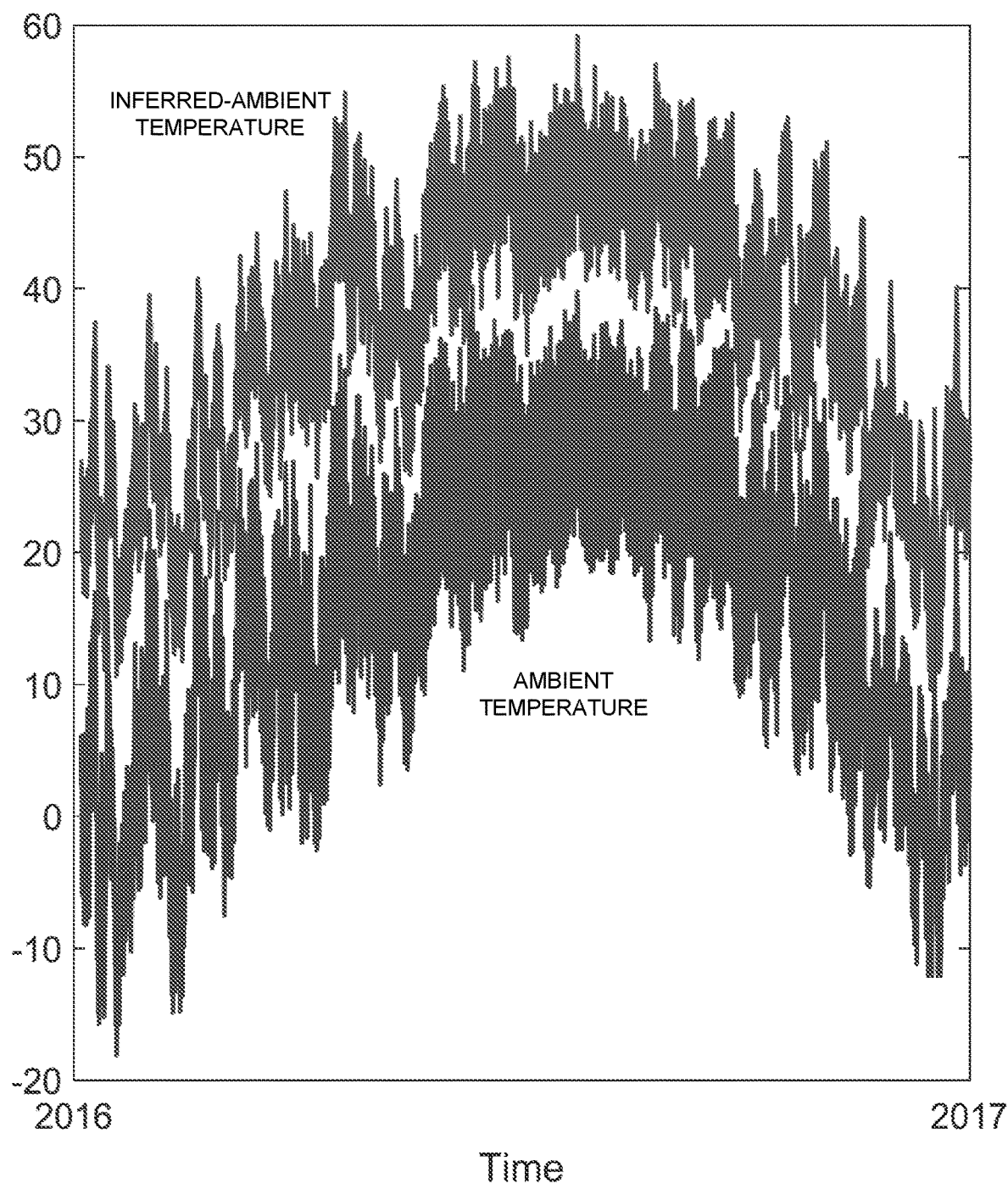
FIG. 13 presents a graph illustrating an overlay comparison between inferred and ambient temperatures for the third transformer in accordance with the disclosed embodiments.

For TR3, FIG. 10 illustrates the simulated measured signals from internal transformer transducers, which contain superimposed thermal dynamics from internal load dynamics and from external diurnal and seasonal dynamics. FIG. 11 shows the corresponding "ambient-compensated" signals computed with the new ambient-temperature-compensation technique. Finally, FIGS. 12 and 13 exhibit the excellent correlation in thermal dynamics between the "inferred-ambient" temperature signal for TR3 versus the corresponding measured-ambient temperature signal.

Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A method for performing thermally-compensated prognostic-surveillance operations for an asset located in an outdoor environment, comprising:
obtaining time-series sensor signals gathered from sensors in the asset during operation of the asset, wherein the time-series sensor signals include temperature signals;
producing thermally-compensated time-series sensor signals by performing a thermal-compensation operation on the temperature signals to compensate for variations in the temperature signals caused by dynamic variations in an ambient temperature of the outdoor environment;

training a prognostic inferential model for a prognostic pattern-recognition system based on the thermally-compensated time-series sensor signals; and during a surveillance mode for the prognostic pattern-recognition system, receiving recently-generated time-series sensor signals from the asset, producing thermally-compensated, recently-generated time-series sensor signals by performing a thermal-compensation operation on temperature signals in the recently-generated time-series sensor signals, and applying the prognostic inferential model to the thermally-compensated, recently-generated time-series sensor signals to detect incipient anomalies that arise during operation of the asset.

2. The method of claim 1, wherein applying the prognostic inferential model to the thermally-compensated, recently-generated time-series sensor signals includes:

using the prognostic inferential model to generate estimated values for the thermally-compensated, recently-generated time-series sensor signals;

performing a pairwise differencing operation between actual values and the estimated values for the thermally-compensated, recently-generated time-series sensor signals to produce residuals; and performing a sequential probability ratio test on the residuals to detect the incipient anomalies that arise during operation of the asset.

3. The method of claim 1, wherein performing the thermal-compensation operation on the temperature signals includes:

estimating the ambient temperature in the outdoor environment by averaging the temperature signals at each observation point in the temperature signals; and subtracting the ambient temperature from each observation in each temperature signal to produce a corresponding thermally-compensated temperature signal.

4. The method of claim 3, wherein averaging the temperature signals at each observation point includes using an adaptive weighting function, which involves:

computing a standard deviation (STD) for each of the temperature signals $[T_1, T_2, \ldots, T_N]$;

computing an inverse STD weight $W_i$ for each computed $STD_i$, wherein $W_i = 1/STD_i$; and using the computed inverse STD weights $[W_1, W_2, \ldots, W_N]$ to estimate the ambient temperature $$T_{amb} = \frac{\sum_{1}^{N} W_i T_i}{\sum_{1}^{N} W_i}$$

for each observation point in the temperature signals.

5. The method of claim 4, wherein computing an STD for each of the temperature signals involves:

identifying a window in the temperature signals for which loads in the asset are substantially at steady state; and computing an STD for each of the temperature signals based on temperature values from the window.

6. The method of claim 1, wherein the inferential model comprises a nonlinear, nonparametric (NLNP) regression model.

7. The method of claim 1, wherein the inferential model comprises a Multivariate State Estimation Technique (MSET) model.

8. The method of claim 1, wherein the incipient anomalies comprise indicators of an impending failure of the asset.

9. The method of claim 1, wherein the asset comprises an electrical transformer in an electrical distribution system.

10. The method of claim 1, wherein in addition to temperature signals, the time-series sensor signals include signals obtained from one or more of the following types of sensors:

a voltage sensor;

a current sensor;

a pressure sensor;

a rotational-speed sensor; and a vibration sensor.

11. A non-transitory, computer-readable storage medium storing instructions that when executed by a computer cause the computer to perform a method for performing thermally-compensated prognostic-surveillance operations for an asset located in an outdoor environment, the method comprising:

obtaining time-series sensor signals gathered from sensors in the asset during operation of the asset, wherein the time-series sensor signals include temperature signals;

producing thermally-compensated time-series sensor signals by performing a thermal-compensation operation on the temperature signals to compensate for variations in the temperature signals caused by dynamic variations in an ambient temperature of the outdoor environment;

training a prognostic inferential model for a prognostic pattern-recognition system based on the thermally-compensated time-series sensor signals; and during a surveillance mode for the prognostic pattern-recognition system, receiving recently-generated time-series sensor signals from the asset, producing thermally-compensated, recently-generated time-series sensor signals by performing a thermal-compensation operation on temperature signals in the recently-generated time-series sensor signals, and applying the prognostic inferential model to the thermally-compensated, recently-generated time-series sensor signals to detect incipient anomalies that arise during operation of the asset.

12. The non-transitory, computer-readable storage medium of claim 11, wherein applying the prognostic inferential model to the thermally-compensated, recently-generated time-series sensor signals includes:

using the prognostic inferential model to generate estimated values for the thermally-compensated, recently-generated time-series sensor signals;

performing a pairwise differencing operation between actual values and the estimated values for the thermally-compensated, recently-generated time-series sensor signals to produce residuals; and performing a sequential probability ratio test on the residuals to detect the incipient anomalies that arise during operation of the asset.

13. The non-transitory, computer-readable storage medium of claim 11, wherein performing the thermal-compensation operation on the temperature signals includes:

estimating the ambient temperature in the outdoor environment by averaging the temperature signals at each observation point in the temperature signals; and subtracting the ambient temperature from each observation in each temperature signal to produce a corresponding thermally-compensated temperature signal.

14. The non-transitory, computer-readable storage medium of claim 13, wherein averaging the temperature signals at each observation point includes using an adaptive weighting function, which involves:
computing a standard deviation (STD) for each of the temperature signals $[T_1, T_2, \ldots, T_N]$;
computing an inverse STD weight $W_i$ for each computed $STD_i$, wherein $W_i=1/STD_i$; and
using the computed inverse STD weights $[W_1, W_2, \ldots, W_N]$ to estimate the ambient temperature $$T_{amb} = \frac{\sum_{1}^{N} W_i T_i}{\sum_{1}^{N} W_i}$$

for each observation point in the temperature signals.

15. The non-transitory, computer-readable storage medium of claim 14, wherein computing an STD for each of the temperature signals involves:
identifying a window in the temperature signals for which loads in the asset are substantially at steady state; and
computing an STD for each of the temperature signals based on temperature values from the window.

16. The non-transitory, computer-readable storage medium of claim 11, wherein the incipient anomalies comprise indicators of an impending failure of the asset.

17. A system that performs thermally-compensated prognostic-surveillance operations for an asset located in an outdoor environment, comprising:
at least one processor and at least one associated memory; and
a prognostic-surveillance mechanism that executes on the at least one processor, wherein during operation, the prognostic-surveillance mechanism:
obtains time-series sensor signals gathered from sensors in the asset during operation of the asset, wherein the time-series sensor signals include temperature signals;
produces thermally-compensated time-series sensor signals by performing a thermal-compensation operation on the temperature signals to compensate for variations in the temperature signals caused by dynamic variations in an ambient temperature of the outdoor environment;
trains a prognostic inferential model for a prognostic pattern-recognition system based on the thermally-compensated time-series sensor signals; and
wherein during a surveillance mode for the prognostic pattern-recognition system, the prognostic-surveillance mechanism:
receives recently-generated time-series sensor signals from the asset,
produces thermally-compensated, recently-generated time-series sensor signals by performing a thermal-compensation operation on temperature signals in the recently-generated time-series sensor signals, and
applies the prognostic inferential model to the thermally-compensated, recently-generated time-series sensor signals to detect incipient anomalies that arise during operation of the asset.

18. The system of claim 17, wherein while applying the prognostic inferential model to the thermally-compensated, recently-generated time-series sensor signals, the prognostic-surveillance mechanism:
uses the prognostic inferential model to generate estimated values for the thermally-compensated, recently-generated time-series sensor signals;
performs a pairwise differencing operation between actual values and the estimated values for the thermally-compensated, recently-generated time-series sensor signals to produce residuals; and
performs a sequential probability ratio test on the residuals to detect the incipient anomalies that arise during operation of the asset.

19. The system of claim 17, wherein while performing the thermal-compensation operation on the temperature signals, the prognostic-surveillance mechanism:
estimates the ambient temperature in the outdoor environment by averaging the temperature signals at each observation point in the temperature signals; and
subtracts the ambient temperature from each observation in each temperature signal to produce a corresponding thermally-compensated temperature signal.

20. The system of claim 19, wherein while averaging the temperature signals at each observation point, the prognostic-surveillance mechanism:
computes a standard deviation (STD) for each of the temperature signals $[T_1, T_2, \ldots, T_N]$;
computes an inverse STD weight $W_i$ for each computed $STD_i$, wherein $W_i=1/STD_i$; and
uses the computed inverse STD weights $[W_1, W_2, \ldots, W_N]$ to estimate the ambient temperature $$T_{amb} = \frac{\sum_{1}^{N} W_i T_i}{\sum_{1}^{N} W_i}$$

for each observation point in the temperature signals.

* * * * *

UNITED STATES PATENT AND TRADEMARK OFFICE
CERTIFICATE OF CORRECTION

PATENT NO. : 10,929,776 B2
APPLICATION NO. : 16/186365
DATED : February 23, 2021
INVENTOR(S) : Gross et al.

It is certified that error appears in the above-identified patent and that said Letters Patent is hereby corrected as shown below:

In the Specification

In Column 8, Lines 3-8, delete "MSET for pattern-recognition purposes, the disclosed embodiments can generally use any one of a generic class of pattern-recognition techniques called nonlinear, nonparametric (NLNP) regression, including neural networks, support vector machines (SVMs), auto-associative kernel regression (AAKR), and even simple linear regression (LR)." and insert the same on Column 8, Line 2, as a continuation of the same paragraph.

In Column 9, Line 13, delete "[$T_i$," and insert -- [$T_1$, --, therefor.

Signed and Sealed this
Twenty-ninth Day of June, 2021

Drew Hirshfeld
*Performing the Functions and Duties of the*
*Under Secretary of Commerce for Intellectual Property and*
*Director of the United States Patent and Trademark Office*